United States Patent [19]

Fischer et al.

[11] Patent Number: 5,268,323
[45] Date of Patent: Dec. 7, 1993

[54] SEMICONDUCTOR ARRAY AND METHOD FOR ITS MANUFACTURE

[75] Inventors: Gerhard Fischer, Unterschleissheim; Walter Plagge, Munich, both of Fed. Rep. of Germany

[73] Assignee: Eurosil electronic GmbH, Fed. Rep. of Germany

[21] Appl. No.: 884,187

[22] Filed: May 18, 1992

[30] Foreign Application Priority Data

Jun. 26, 1991 [DE] Fed. Rep. of Germany ....... 4121051

[51] Int. Cl.$^5$ .......................................... H01L 21/70
[52] U.S. Cl. .......................... 437/57; 257/69; 257/204
[58] Field of Search ................... 437/57; 257/69, 204

[56] References Cited

U.S. PATENT DOCUMENTS

| | | | |
|---|---|---|---|
| 4,703,552 | 11/1987 | Baldi et al. | 437/45 |
| 4,804,636 | 2/1989 | Groover, III et al. | 437/52 |
| 4,890,141 | 12/1989 | Tang et al. | 257/372 |
| 5,010,032 | 4/1991 | Tang et al. | 437/57 |
| 5,190,886 | 3/1993 | Asahina | 437/57 |

FOREIGN PATENT DOCUMENTS

| | | |
|---|---|---|
| 0293588 | 12/1988 | European Pat. Off. . |
| 2906249 | 8/1979 | Fed. Rep. of Germany . |
| 2905022 | 9/1990 | Fed. Rep. of Germany . |
| 0237150 | 9/1990 | Japan ........................... 437/57 |

OTHER PUBLICATIONS

IBM Technical Disclosure Bulletin, vol. 32, No. 3B, Aug., 1989, "CMOS Processes With Low Resistance p- And n-Doped Gates".

Primary Examiner—Olik Chaudhuri
Assistant Examiner—Long Pham
Attorney, Agent, or Firm—Spencer, Frank & Schneider

[57] ABSTRACT

A semiconductor array in a CMOS technology is described in which the gate electrodes are of $p^+$-doped polysilicon in the case of p-channel transistors and of $n^+$-doped polysilicon in the case of n-channel transistors. If the gate electrodes of two complementary transistors are connected at the gate level, a polysilicon diode is created at the connection point. In accordance with the invention, the polysilicon diode is short-circuited with a polysilicide layer. A method is described for short-circuiting this polysilicon diode without additional masking steps using a metal silicide layer. In a further embodiment of the invention, the silicide is restricted to the area of the polysilicon diode. In addition, a method is described using which the polysilicon diodes can be short-circuited in a self-adjusting polysilicide process.

3 Claims, 3 Drawing Sheets

SEMICONDUCTOR ARRAY AND METHOD FOR ITS MANUFACTURE

FIELD OF THE INVENTION

The invention relates to a method for manufacture of a semiconductor array of the type having an n-channel MOS transistor and a p-channel MOS transistor, with the gate electrodes of the two transistors being polysilicon which is doped in accordance with the respective channel type and being connected to one another such that a polysilicon diode is created at their connection point.

To manufacture in a CMOS technology transistors with gate lengths of less than 2 μm and low operating voltages, it is necessary to manufacture the gate electrodes of p+-doped polysilicon in the case of p-channel transistors and of n+-doped polysilicon in the case of n-channel transistors. If a logic element is constructed from two such p- and n-channel transistors whose gate electrodes are connected to one another on the polysilicon level, for example in a CMOS inverter, a polysilicon diode is created at the connection point of the p+-doped polysilicon gate of the p-channel transistor and of the n+-doped polysilicon gate of the n-channel transistor. With a few exceptions, this polysilicon diode is undesirable and must therefore be short-circuited to ensure functioning of the logic element. This is usually achieved with the aid of metallization paths disposed on the polysilicon diodes and with contact holes disposed on both sides of the p+/n+-junction. A drawback of short-circuiting the polysilicon diodes in this manner is that the provision of the contacts entails an increased space requirement in the area of the short-circuited polysilicon diode. Furthermore, when manufacturing a semiconductor element of this type, additional masking and photo steps are necessary.

European patent EP 325 328 A1 describes a method of providing the polysilicon with a metal-silicide layer in the case of MOS transistors with polysilicon gate electrodes. This results in a reduction of the layer resistance of the gate electrode and hence in a higher switching speed of the transistor.

SUMMARY OF THE INVENTION

The object of the invention is therefore to provide a method of manufacturing a semiconductor array of the type first mentioned above in which the polysilicon diodes are short-circuited without increased space requirement and which can be manufactured without additional masking and photo steps. The above object is attained according to a first embodiment of the invention by a method of manufacturing a semiconductor array having an n-channel MOS transistor and a p-channel MOS transistor, with the gate electrodes of the two transistors being polysilicon which is doped in accordance with the respective channel type and being connected to one another such that a polysilicon diode is created at their connection point, wherein the entire surface of the polysilicon path comprising the two gate electrodes and the diode at their connection is covered with a metal silicide layer, with the method including the performance of the following process steps:

manufacturing well areas of the second conductivity type in a semiconductor substrate of the first conductivity type;

structuring active areas of the p-channel and n-channel transistors by a field oxide;

covering the active areas with gate oxide;

depositing polysilicon over the entire surface;

structuring the polysilicon to generate a polysilicon path that extends over the well edge and forms both gate electrodes;

implanting the active areas and the portion of the polysilicon path in the substrate area with dopants for the second conductivity type;

implanting the active areas and the portion of the polysilicon path in the well area with dopants for the first conductivity type;

depositing titanium over the entire surface;

high temperature heating to cause the titanium to react with silicon to form titanium silicide and to simultaneously activate the dopants; and removing the metallic titanium followed by the usual steps for passivation, metallization, etc.

The above object is attained according to a further embodiment of the invention by a method of manufacturing a semiconductor array having an n-channel MOS transistor and a p-channel MOS transistor, with the gate electrodes of the two transistors being polysilicon which is doped in accordance with the respective channel type and being connected to one another such that a polysilicon diode is created at their connection point, wherein the polysilicon path composed of the two gate electrodes and the diode at their connection is covered with a metal silicide layer only in the area of the polysilicon diode, with the method including the performance of the following process steps:

manufacturing well areas of the second conductivity type in a semiconductor substrate of the first conductivity type;

structuring active areas of the p-channel and n-channel transistors by a field oxide;

covering the active areas with gate oxide;

depositing polysilicon over the entire surface;

structuring the polysilicon to generate a polysilicon path that extends over the well edge and forms both gate electrodes;

forming an oxide layer on the polysilicon path;

depositing a nitride layer and a first photoresist layer over the entire surface;

structuring the first photoresist layer such that the surface above the substrate area is covered with photoresist material, with the material being set back from the well edge;

removing the exposed portion of the nitride layer;

implanting dopants of the first conductivity type;

removing the first photoresist layer and applying a second photoresist layer over the entire surface;

structuring the second photoresist layer such that the surface above the well area is covered with photoresist material which is set back from the well edge;

removing the oxide layer on the polysilicon path where the oxide layer is not covered by the nitride layer or by the second photoresist layer;

removing the remaining nitride layer;

implanting dopants of the second conductivity type;

removing the second photoresist layer;

depositing titanium over the entire surface;

high-temperature heating to cause the titanium to react with silicon to form titanium silicide and to activate the dopants at the same time; and removing the metallic titanium, followed by the usual process steps for passivation, metallization, etc.

PREFERRED EMBODIMENT

Figure 1:
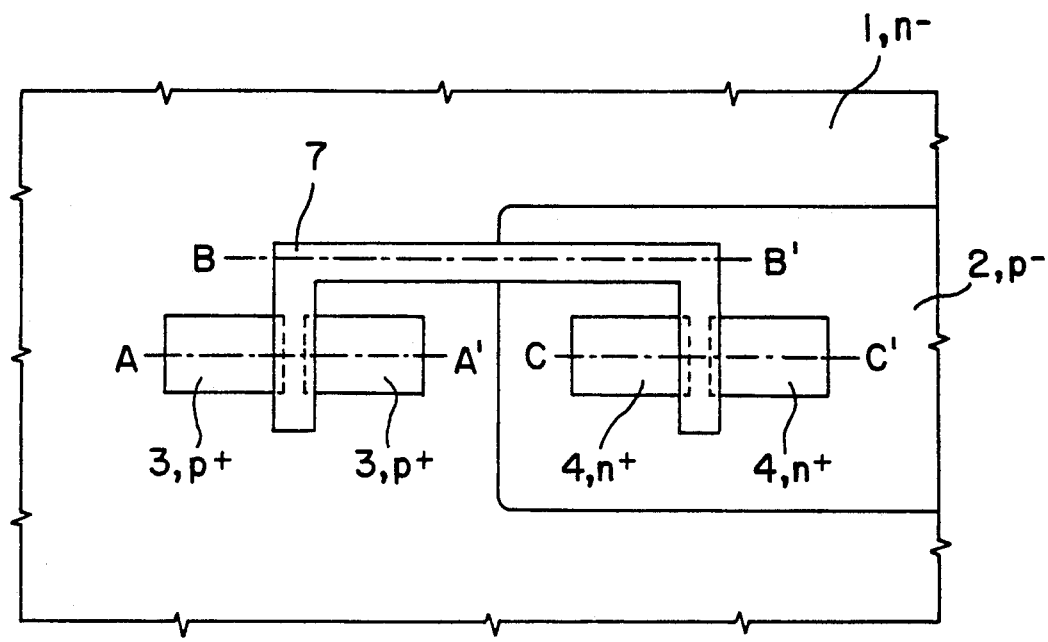
FIG. 1 shows a plan view of a semiconductor array in accordance with the invention.

FIG. 1 shows a CMOS semiconductor array comprising an n-channel transistor and a p-channel transistor having gate electrodes connected on the polysilicon level.

Figure 2:
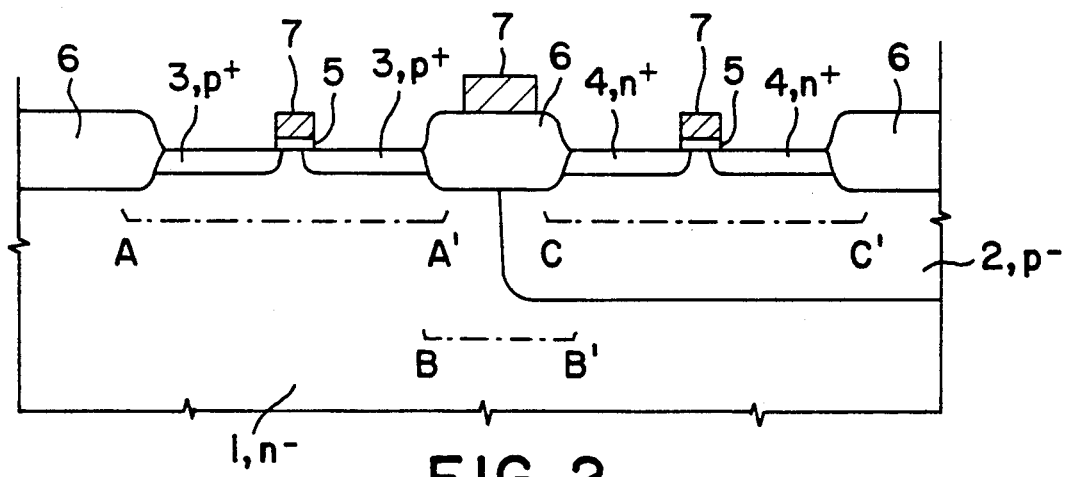
FIG. 2 shows a cross-section through the semiconductor array in FIG. 1, along the lines A—A', B—B', C—C'.

FIG. 2 shows a section through the array according to FIG. 1, where the line BB' is shown shortened for greater clarity. The p-channel transistor is located in the area of the line AA' in substrate 1, and the n-channel transistor in the area of the line CC' in a p-well 2. The polysilicon gate electrodes 7 of the p-channel and n-channel transistors are connected to one another by means of a polysilicon path 7 along the line BB'. The polysilicon 7 of the gate electrodes is $p^+$-doped in the area of the p-channel transistor and $n^+$-doped in the area of the n-channel transistor. In the area of the well edge, the doping changes from n to p and the polysilicon diode is created. In accordance with the invention, a metal silicide layer 13 is provided on the polysilicon path 7 and bridges the polysilicon diode created at the transition from the $p^+$-doped to the $n^+$-doped polysilicon. In a first embodiment of the invention, the silicide layer is provided over the entire polysilicon path 7. In this embodiment, the silicide layer not only short-circuits the polysilicon diode, but also reduces the layer resistance of the gate electrode and hence affects the switching characteristics of the transistor. In a further preferred embodiment of the invention, the silicide layer is restricted to the area around the polysilicon diode. The polysilicon diode is short-circuited without changing the properties of the transistors. In the following, both embodiments of the invention are described on the basis of a method for their manufacture.

The starting point for both embodiments is an n-conducting substrate 1. P-conducting well areas 2 are generated in substrate 1 using known process steps. The active areas 3, 4 are then surrounded with field oxide 6 and covered with gate oxide 5. After deposition of polysilicon, the polysilicon gate electrodes 7 are structured such that the gate electrodes of the n-channel and p-channel transistors are connected to one another on the polysilicon level.

In the method for manufacture of the first embodiment of the semiconductor array in accordance with the invention, $n^+$-doping of the active areas 4 and of the polysilicon 7 in the p-well area 2 and $p^+$-doping of the active areas 3 and of the polysilicon 7 in the n-conducting substrate area 1 then follows. In this way, an n-channel transistor with an n-doped polysilicon gate electrode is created, and a p-channel transistor with a $p^+$-doped polysilicon gate electrode, the gate electrodes being connected to one another on the polysilicon level. A polysilicon diode is created on the p-well edge in the polysilicon path 7 at the transition from p-doping to n-doping. In the next process step, titanium is deposited over the entire surface and tempered in a high-temperature step. During this high-temperature step, the titanium reacts with the exposed silicon to form titanium silicide. The titanium does not react with the silicon oxide underneath and can then be removed from there. If the oxide layer has been removed from the active areas prior to deposition of the titanium, silicide is on the polysilicon path 7 and on the active areas 3, 4, if not exclusively on the polysilicon path 7.

The silicide layer therefore bridges the polysilicon diode resulting from the doping change in the polysilicon path 7 at the p-well edge and at the same time reduces the layer resistance of the polysilicon gate electrode. This leads to a change in the switching characteristics of a CMOS gate constructed from this pair of transistors.

Figure 3:
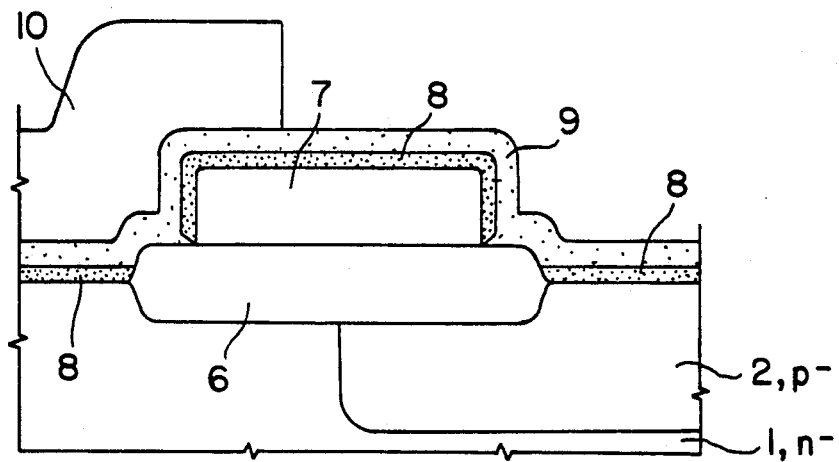
FIGS. 3-9 show sections through a semiconductor array in various process steps of the manufacturing method in accordance with the invention.

If the metal silicide layer is to be restricted to the area of the polysilicon diode, the process steps following polysilicon structuring must be changed. The method for manufacture of the semiconductor array described above using the silicide layer restricted to the area of the polysilicon diode is explained in the following on the basis of FIGS. 3 to 9. FIGS. 3 to 9 show the section BB' from FIG. 2 in enlarged form. After polysilicon structuring, the polysilicon path 7 is surrounded with an oxide 8. The entire semiconductor surface is then covered first with a nitride layer 9 and then with a first photoresist layer 10. The first photoresist layer 10 is structured in an exposure and etching step in such a way that the semiconductor surface above the p-well and a peripheral zone projecting beyond the p-well edge and above the n-substrate area are free of the first photoresist layer 10 (FIG. 3).

Figure 4:
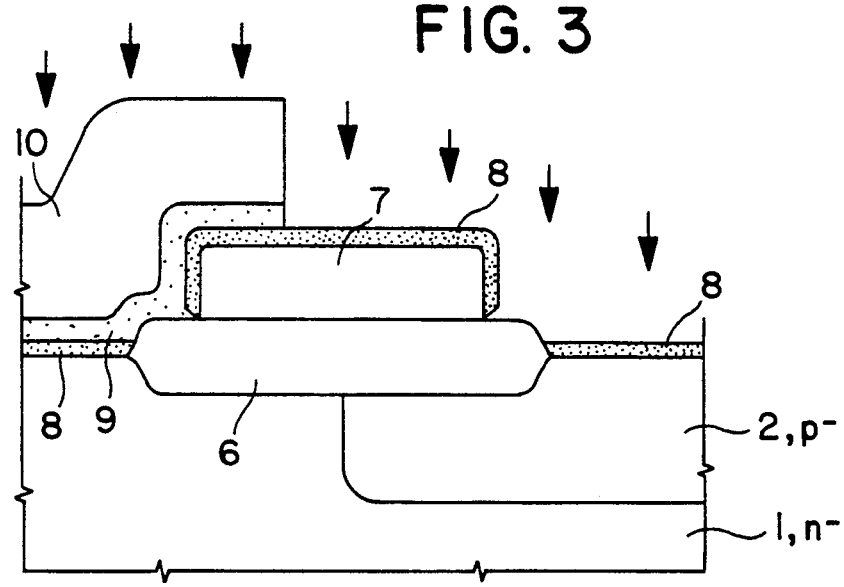

In the next process step, the previously exposed nitride layer 9 is removed and the semiconductor surface is then doped by phosphor implantation. The impurity atoms penetrate effectively only into those surfaces exposed by the first photoresist layer 10 and nitride layer 9, and can be activated in a later process step (FIG. 4).

Figure 5:
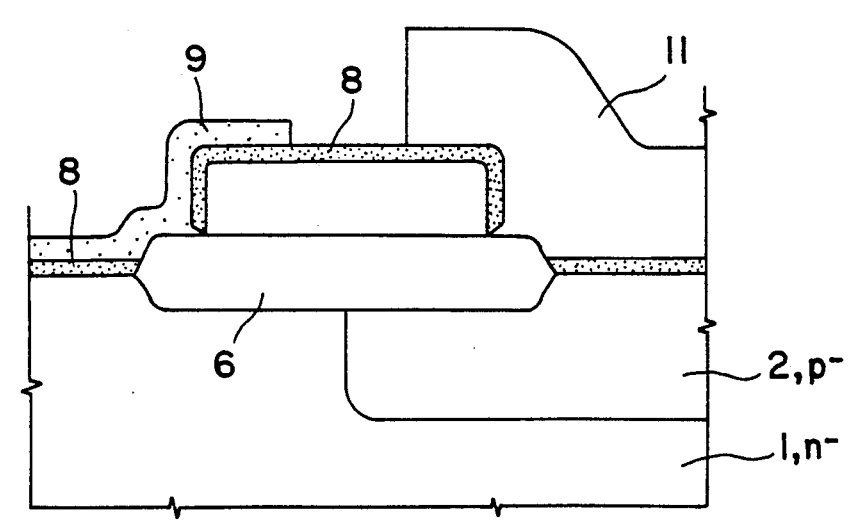

After impurity implantation, the remaining first photoresist layer 10 is removed and a second photoresist layer 11 is applied. The second photoresist layer 11 is structured in an exposure and etching step in such a way that the surface above the n-substrate area and a peripheral zone projecting beyond the p-well edge and above the p-well area are free of the second photoresist layer 11 (FIG. 5).

Figure 6:
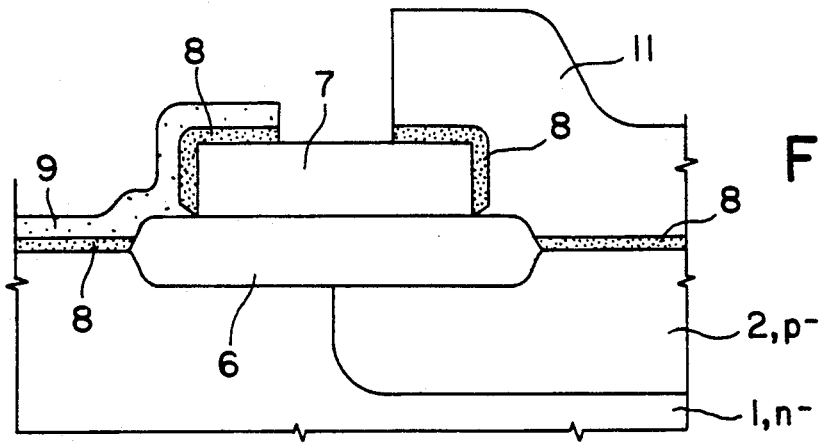
Figure 7:
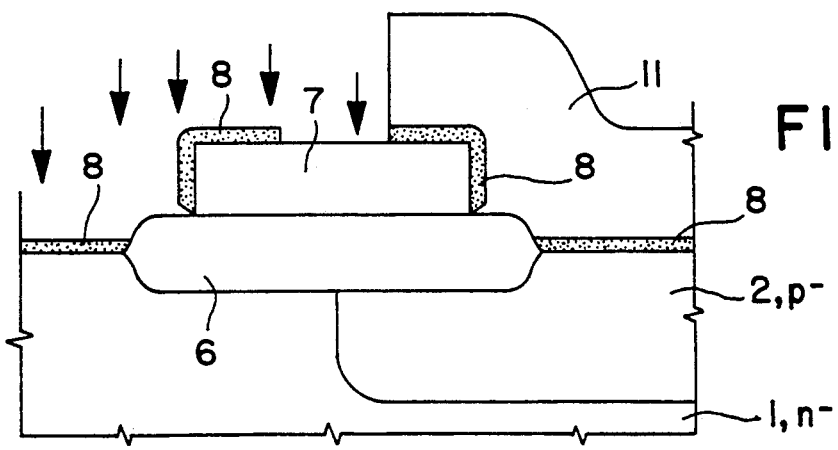
Figure 8:
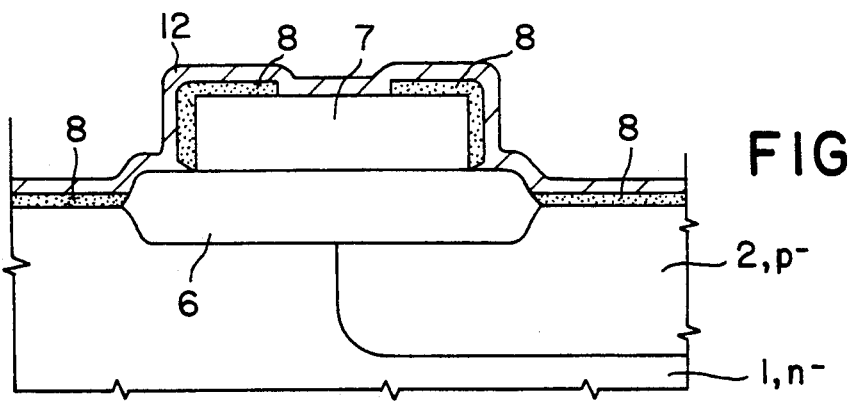

On the surface of the semiconductor array, the nitride layer 9 is located above the n-substrate area, the second photoresist layer 11 above the p-well area, and the oxide layer 8 above the p-well edge in the area of the peripheral zone. This area of the oxide layer 8 on the surface is removed in the next process step, so that the polysilicon 7 underneath is exposed in the area of the well edge (FIG. 6). The remaining nitride layer 9 is then removed and in the following boron implantation impurities penetrate into the semiconductor areas not covered by the second photoresist layer 11 (FIG. 7). The second photoresist layer 11 is then removed and the entire semiconductor surface is coated with titanium 12 (FIG. 8). The semiconductor array is then tempered in a high-temperature step, in which the implanted impurities in the active areas 3, 4 and in the polysilicon path 7 are activated and at the same time the titanium 12 reacts at those points in which it contacts silicon to form titanium silicide. The titanium on the oxide and field oxide does not react, and can subsequently be removed.

Figure 9:
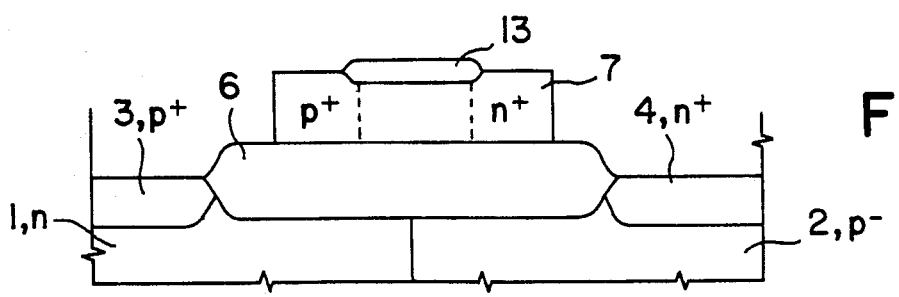

FIG. 9 shows a section from the semiconductor array in accordance with the invention. The polysilicon path 7 is effectively bridged by a polysilicide layer 13 in the area of the well edge where doping changes from n to p. The polysilicon path is heavily n-doped in the area of the p-well and heavily p-doped in the area of the n-substrate. Directly above the well edge, the set-back masking creates an area whose effective doping depends on the two implantation steps. The polysilicide layer above it however contacts the two low-resistance areas adjacent to the high-resistance central area, since the silicide has expanded into the two low-resistance areas during the high-temperature step on account of the high mobility of the titanium.

The process steps described above are followed by the usual process steps for metallization, passivation etc.

The invention is equally applicable to CMOS processes with p-conducting substrate and n-conducting well areas.

With the semiconductor arrays in accordance with the invention, the polysilicon diodes are effectively bridged at the transition of the polysilicon path 7 from the substrate area to the well area.

The two self-adjusting methods described above permit short-circuiting of the polysilicon diodes without additional masking measures.

The method can also be applied to semiconductor arrays with different well complexes, for every type of oxide insulation and source/drain implantation. All other silicide-capable metals can be used in addition to titanium.

What is claimed is:

1. A method for manufacture of a semiconductor array having an n-channel MOS transistor and a p-channel MOS transistor, with the gate electrodes of the two transistors being polysilicon which is doped in accordance with the respective channel type and being connected to one another such that a polysilicon diode is created at their connection point, wherein the entire surface of the polysilicon path comprising the two gate electrodes and the diode at their connection is covered with a metal silicide layer, said method including the performance of the following process steps:

manufacturing well areas of the second conductivity type in a semiconductor substrate of the first conductivity type;
structuring active areas of the p-channel and n-channel transistors by a field oxide;
covering said active areas with gate oxide;
depositing polysilicon over the entire surface;
structuring the polysilicon to generate a polysilicon path that extends over the well edge and forms both gate electrodes;
implanting said active areas and the portion of the polysilicon path in the substrate area with dopants for the second conductivity type;
implanting said active areas and the portion of the polysilicon path in the well area with dopants for the first conductivity type;
depositing titanium over the entire surface;
high temperature heating to cause the titanium to react with silicon to form titanium silicide and to simultaneously activate the dopants; and
removing the metallic titanium.

2. A method according to claim 1, wherein prior to the titanium deposition process step the gate oxide is removed from said active areas and hence a silicide layer is also generated on said active areas.

3. A method for manufacture of a semiconductor array having an n-channel MOS transistor and a p-channel MOS transistor, with the gate electrodes of the two transistors being polysilicon which is doped in accordance with the respective channel type and being connected to one another such that a polysilicon diode is created at their connection point, wherein the polysilicon path composed of the two gate electrodes and the diode at their connection is covered with a metal silicide layer only in the area of the polysilicon diode, said method including the performance of the following process steps:

manufacturing well areas of the second conductivity type in a semiconductor substrate of the first conductivity type;
structuring active areas of the p-channel and n-channel transistors by a field oxide;
covering said active areas with gate oxide;
depositing polysilicon over the entire surface;
structuring the polysilicon to generate a polysilicon path that extends over the well edge and forms both gate electrodes;
forming an oxide layer on said polysilicon path;
depositing a nitride layer and a first photoresist layer over the entire surface;
structuring said first photoresist layer such that the surface above the substrate area is covered with photoresist material, said material being set back from the well edge;
removing the exposed portion of said nitride layer;
implanting dopants of the first conductivity type;
removing said first photoresist layer and applying a second photoresist layer over the entire surface;
structuring said second photoresist layer such that the surface above said well area is covered with the photoresist, said material being set back from the well edge;
removing said oxide layer on said polysilicon path where said layer is not covered by said nitride layer or by said second photoresist layer;
removing the remaining nitride layer;
implanting dopants of the second conductivity type;
removing said second photoresist layer;
depositing titanium over the entire surface;
high-temperature heating to cause the titanium to react with silicon to form titanium silicide and to activate the dopants at the same time; and
removing the metallic titanium.

* * * * *